United States Patent
Khozyainov

(10) Patent No.: US 8,789,747 B2
(45) Date of Patent: Jul. 29, 2014

(54) CONNECTION SENSOR FOR IDENTIFYING THE PATCH PANEL PORT

(75) Inventor: Boris Alekseevich Khozyainov, Korolev (RU)

(73) Assignee: Boris A. Khozyainov, Korolev (RU)

( * ) Notice: Subject to any disclaimer, the term of this patent is extended or adjusted under 35 U.S.C. 154(b) by 573 days.

(21) Appl. No.: 12/745,543

(22) PCT Filed: Jan. 23, 2009

(86) PCT No.: PCT/RU2009/000014
§ 371 (c)(1),
(2), (4) Date: Oct. 28, 2010

(87) PCT Pub. No.: WO2009/096815
PCT Pub. Date: Aug. 6, 2009

(65) Prior Publication Data
US 2011/0049232 A1    Mar. 3, 2011

(30) Foreign Application Priority Data

Jan. 31, 2008  (RU) ................................ 2008103043

(51) Int. Cl.
*G06F 17/00*    (2006.01)
(52) U.S. Cl.
USPC ........................................................ 235/375

(58) Field of Classification Search
USPC ............................................................ 235/375
See application file for complete search history.

(56) References Cited

U.S. PATENT DOCUMENTS

| | | | |
|---|---|---|---|
| 6,424,710 B1 * | 7/2002 | Bartolutti et al. | 379/326 |
| 2004/0186908 A1 * | 9/2004 | Amdahl et al. | 709/227 |
| 2006/0125607 A1 * | 6/2006 | Gunther et al. | 340/10.52 |
| 2010/0110634 A1 * | 5/2010 | Woodbury et al. | 361/698 |

* cited by examiner

*Primary Examiner* — Michael G Lee
*Assistant Examiner* — David Tardif

(57) ABSTRACT

The invention relates to communication technology. Use of the invention for identifying the patch panel port, employed for connecting a network device, allows to identify a port or a cable attached to that port, there through the data communication being carried out. This technical result is achieved by steps of: configuring each of connection sensors, allotted to patch panel ports, with an inductance coil for perceiving magnetic part of stray electromagnetic radiation at the location of appearance of non-uniformity in a cable channel; disposing each of connection sensors nearby a separated wire of the cable connected to the respective patch panel port, identifying a specific patch panel port by a data processing unit, to which all connection sensors being connected, according to a signal from the connection sensor corresponding to this port on perceiving the stray electromagnetic radiation by this connection sensor.

1 Claim, 1 Drawing Sheet

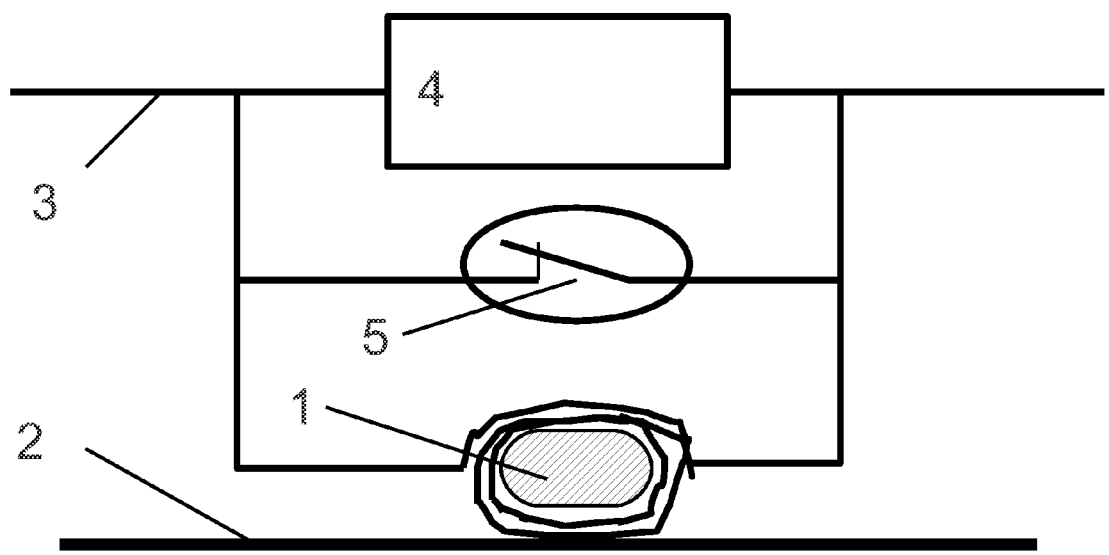

CONNECTION SENSOR FOR IDENTIFYING THE PATCH PANEL PORT

FIELD OF THE INVENTION

The present invention relates to the communication technology and can be used for identifying the patch panel port employed for connecting a network device.

BACKGROUND OF THE INVENTION

At present, various means are known for determining the particular patch panel port, through which a connection and signal transmission of the network device is performed.

For example, the U.S. Pat. No. 6,424,710 (Jul. 23, 2003) discloses the similar system. Every patch panel port in the systems according to the Patent is provided with the respective sensor acting when a cable termination is inserted into this port. However it is impossible to identify in these systems a cable connected to this panel, through which cable the data transmission is performed by the network device.

The most closest analog is described in the Russian Patent No. 2310210 (Nov. 10, 2007). Ports of a patch panel is provided with corresponding connection sensors. The sensors are configured for perceiving signals of stray electromagnetic radiation at the location of appearance of non-uniformity in a cable channel. The sensors are disposed nearby the respective patch panel ports at a distance sufficient for perceiving signals of the stray electromagnetic radiation occurred at the location of appearance of non-uniformity in the cable channel nearby this port in connecting the cable thereto, when transmitting respective signals via this cable. A data processing unit identifies a particular patch panel port by, to which all connection sensors being connected, according to a signal from the connection sensor corresponding to this port upon perceiving the stray electromagnetic radiation by this connection sensor. The sensors described in the Patent detect the stray electromagnetic radiation in whole but do not single out a specific part (electrical or magnetic) of the radiation.

SUMMARY OF THE INVENTION

Thus, the object of the present invention consists in developing such sensor for identifying a patch panel port that perceive one between consisting part of electromagnetic radiation—magnetic one.

In order for achieving the technical result, it is proposed a connection sensor for identifying a patch panel port, each port of which patch panel being intended for a cable connection of network device, wherein, in accordance with the present invention, the connection sensor being configured for perceiving signals of electromagnetic radiation appeared as a side effect in the cable channel, when transmitting respective signals via this cable, and disposed nearby a respective patch panel port at a distance sufficient for perceiving said signals of electromagnetic radiation and at a distance from any of other patch panel ports excluding false responses of the connection sensor due to signals of electromagnetic radiation of a cable channel to any of these other ports, and being connected to a data processing unit configured for identifying a particular patch panel port on the basis of signals of the connection sensor. Furthermore said sensor comprises an inductance coil for perceiving magnetic part of electromagnetic radiation. The inductance coil is arranges near the separated wire of said cable. Said inductance coil comprises coils of wire arranged so that magnetic part of electromagnetic radiation appeared near the separated wire produces electromotive force in the inductance coil.

The proposed sensor can contain a RFID tag. The level of replay signal of said RFID tag is said signal for the data processing unit.

The said sensor can contains the sensors of presence of the patch cord plug in the patch panel port. Said sensors of presence can be a dry reed switch.

The RFID tag of the sensor can be active one. Said sensor can contain frequency filters.

BRIEF DESCRIPTION OF THE DRAWINGS

FIG. 1 depicts the diagram of the sensors for persevering of the magnetic part of electromagnetic radiation.

DETAILED DESCRIPTION OF THE INVENTION

The sensor of the present invention can be implemented in several similar embodiments that are, nevertheless, described in the patent RU No. 2310210.

FIG. 1 presents the sensor for perceiving magnetic part of electromagnetic radiation. It contains a tiny inductance coil 1 located along a separated wire 2 of a cable, for example, UTP. Access to the separated wire is possible when separated wire of the cable is terminated at a patch panel port. The coil 1 can be wound around a ferritic or metallic core. The coil 1 locates close to separated wire 2 because the closer the coil is to the wire the stronger magnetic field is. The coils of the unit 1 is arranged so that direction of magnetic field from the separated wire 2 is almost perpendicular to the plane of the coils. The magnetic field is directed alone concentric circles that have their center at the wire 2. In this case EMF (electromotive force) is stronger.

In general the value of the EMF (or the information about EMF changing) can be transmitted to the data processing unit through some wires. However to transmit the date a RFID tag is used. The RFID tag can be near field one. In this case a far-field RFID tag is used.

The coil 1 is connected parallel to an antenna 3 which is connected to a RFID transponder chip 4. In addition a dry reed switch 5 is connected to the circuit of antenna 3. The dry reed switch is a sensor of presence of a plug in the patch panel port. As described in FIG. 5 of the U.S. Pat. No. 6,424,710 the dry reed switch is located near a patch panel port. The patch cord plug is supplied with a permanent magnet. The dry reed switch 5 is normally closed. The antenna 3 is a dipole antenna.

When a patch cord plug is not connected to the patch panel port the dry reed switch 5 is closed and "short" the antenna 3 as well as the coil 1. Apparently there is not electromagnetic radiation near separated wire 2. In this case the RFID tag transmits the signal with some RSSI (Received Signal Strength Indication supported, for example, by Symbol XR480 RFID reader or readers based on Intel R1000 chip) or the tag is not available for reading at all. When a plug is connected to the patch panel port the dry reed switch is opened and RSSI of the RFID tag changes. Thus presence of plug in the patch panel port can be detected. When the plug is connected the data can be transmitted. In this case there is some current in the separated wire 2. The current produced alternating magnetic field which generates EMF in the coil 1. In general the voltage of the coil 1 can be processed by a electronic amplifier (for example by a operational amplifier or a comparator detecting the signal by a diode). The sensor in FIG. 1 uses the fact that the data signal in the separated wire 2 has harmonics of waves which are close to the frequency of the RFID tag. Particularly 1000Base-T signal contains harmonics of wave up to 1 GHz which are close to RFID EPC Gen2 frequency 866 MHz. In this case a noise signal appears at inputs of transponder 14. The noise changes RSSI of the RFID tag. Using said change the moment of data transmission beginning can be defined.

If the dry reed switch is absent then sensor operates as the similar sensor is described in the patent RU No. 231021.

It is possible to use frequency filters (passive, for example RC) to detect specific frequency constituent of electromagnetic radiation.

Active RFID tags with a power supply can be used to increase the range distance of the RFID tags. Sometimes the coil and the dry reed switch can be moved from the transponder chip. In this case they can be connected to the sensor circuit by a twisted pair extender that decreases of perceiving of an RFID interrogator radiation by the extender. Apparently the impedance matching element can be implemented in the sensor for matching impedance of the sensor components. The components can be a part of the IC.

Thus it can be detected when data is transmitted or not transmitted over the cable. It is base for determining the port where a network device is connected as described in the patent RU No. 2310210.

The invention claimed is:

1. A connection sensor for identifying a patch panel port, where each port of said patch panel being intended for a cable connection of a network device, said connection sensor being configured for perceiving signals of electromagnetic radiation appeared as a side effect in the cable channel, when transmitting respective signals via this cable, and disposed nearby a respective port of said patch panel at a distance sufficient for perceiving said signals of electromagnetic radiation and at a distance from any of other ports of said patch panel excluding false responses of said connection sensor due to signals of electromagnetic radiation of a cable channel to any of these other ports, and being connected to a data processing unit configured for identifying a particular port of said patch panel on the basis of signals of said connection sensor, characterized in that said sensor comprises an inductance coil for perceiving magnetic part of electromagnetic radiation; said inductance coil is arranges near a separated wire of said cable; said inductance coil comprises coils of wire arranged so that magnetic part of electromagnetic radiation appeared near said separated wire produces electromotive force in said inductance coil.

* * * * *